United States Patent
Hattori et al.

(10) Patent No.: US 9,374,901 B2
(45) Date of Patent: Jun. 21, 2016

(54) MONOLITHIC CAPACITOR MOUNTING STRUCTURE AND MONOLITHIC CAPACITOR

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 350 days.

(21) Appl. No.: 13/960,829

(22) Filed: Aug. 7, 2013

(65) Prior Publication Data

US 2014/0041915 A1    Feb. 13, 2014

(30) Foreign Application Priority Data

Aug. 10, 2012 (JP) .................. 2012-177638
Aug. 10, 2012 (JP) .................. 2012-177639

(51) Int. Cl.
*H01G 4/228* (2006.01)
*H01G 4/30* (2006.01)
*H05K 1/18* (2006.01)
*H01G 2/06* (2006.01)
(Continued)

(52) U.S. Cl.
CPC .............. *H05K 1/18* (2013.01); *H01G 2/065* (2013.01); *H01G 4/232* (2013.01); *H01G 4/30* (2013.01); *H05K 1/181* (2013.01); *H05K 3/3442* (2013.01); *H05K 2201/10015* (2013.01); *H05K 2201/2045* (2013.01); *Y02P 70/611* (2015.11)

(58) Field of Classification Search
USPC ................... 361/303, 306.1, 306.3, 301.4
See application file for complete search history.

(56) References Cited

U.S. PATENT DOCUMENTS 4,953,273 A      9/1990  Insetta et al.
6,995,967 B2 *   2/2006  Togashi ............ H01G 4/012
                                                361/301.3
(Continued)

FOREIGN PATENT DOCUMENTS

CN    101038817 A    9/2007
JP    62-30594 U     2/1987
(Continued)

OTHER PUBLICATIONS

Official Communication issued in corresponding Japanese Patent Application No. 2012-177639, mailed on Jun. 24, 2014.
(Continued)

*Primary Examiner* — Eric Thomas
(74) *Attorney, Agent, or Firm* — Keating & Bennett, LLP

(57) ABSTRACT

In a monolithic capacitor mounting structure, assuming that a portion of a first outer electrode joined with a first bonding material is a first bonding portion and a portion of a second outer electrode joined with a second bonding material is a second bonding portion, a length of each of the first and second bonding portions in a lengthwise direction of the monolithic capacitor is about 0.2 times to about 0.5 times a length of an elementary body in the lengthwise direction, and a center of each of the first and second bonding portions in the lengthwise direction is located at a position different from a center of the elementary body in the lengthwise direction. Vibration noise is changed depending on positions of outer electrodes of the monolithic capacitor, the outer electrodes being used to bond the monolithic capacitor to a mounting substrate.

20 Claims, 15 Drawing Sheets

(51) Int. Cl.
*H01G 4/232* (2006.01)
*H05K 3/34* (2006.01)

(56) References Cited

U.S. PATENT DOCUMENTS

| | | | |
|---|---|---|---|
| 7,310,218 B2 * | 12/2007 | Togashi | H01G 4/232 361/306.3 |
| 2005/0286205 A1 | 12/2005 | Togashi et al. | |
| 2008/0074826 A1 | 3/2008 | Lee et al. | |
| 2010/0182732 A1 | 7/2010 | Togashi | |

FOREIGN PATENT DOCUMENTS

| JP | 63-137971 U | 9/1988 |
|---|---|---|
| JP | 3-148813 A | 6/1991 |
| JP | 08-055752 A | 2/1996 |
| JP | 10256695 A * | 9/1998 |
| JP | 11-40459 A | 2/1999 |
| JP | 2003-51424 A | 2/2003 |
| JP | 2006-100451 A | 4/2006 |
| JP | 2007-194312 A | 8/2007 |
| JP | 2008-160162 A | 7/2008 |
| JP | 2008-171949 A | 7/2008 |
| JP | 2010-171061 A | 8/2010 |
| JP | 2012-94670 A | 5/2012 |
| KR | 10-2008-0027030 A | 3/2008 |
| WO | 2008/143075 A1 | 11/2008 |

OTHER PUBLICATIONS

Official Communication issued in corresponding Japanese Patent Application No. 2012-177638, mailed on Jun. 24, 2014.
Official Communication issued in corresponding Korean Patent Application No. 10-2013-0094145, mailed on Jul. 7, 2014.

* cited by examiner

Fig.1
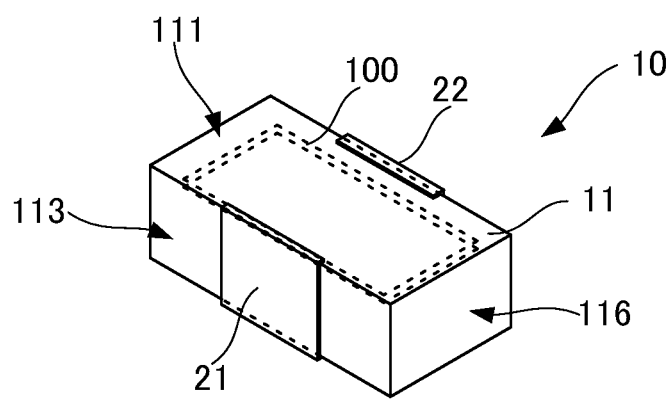
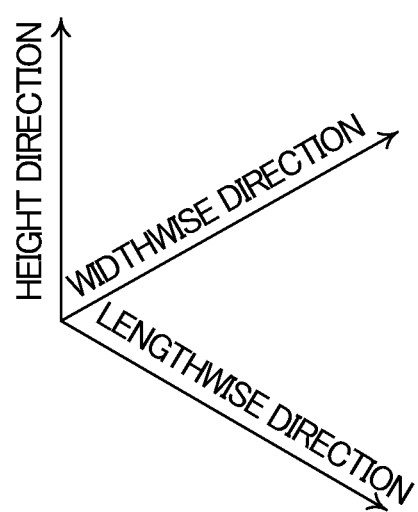

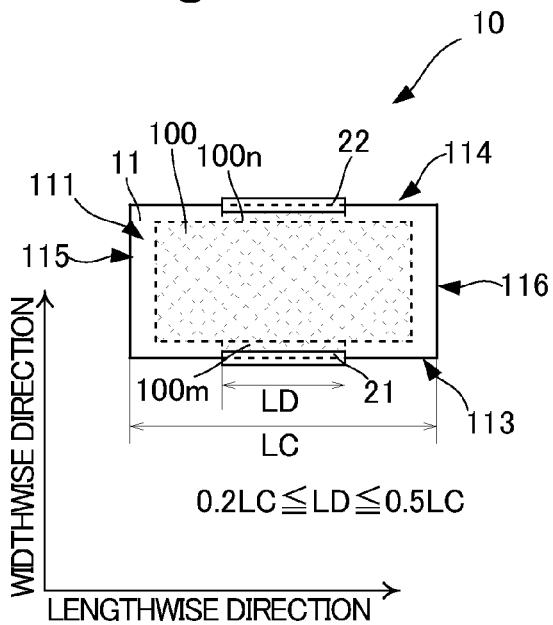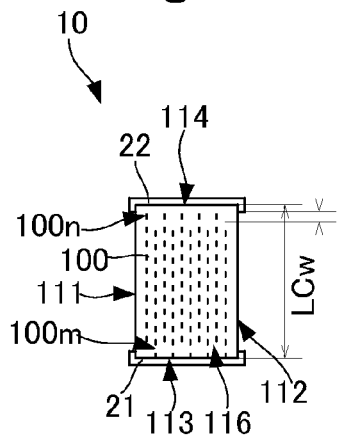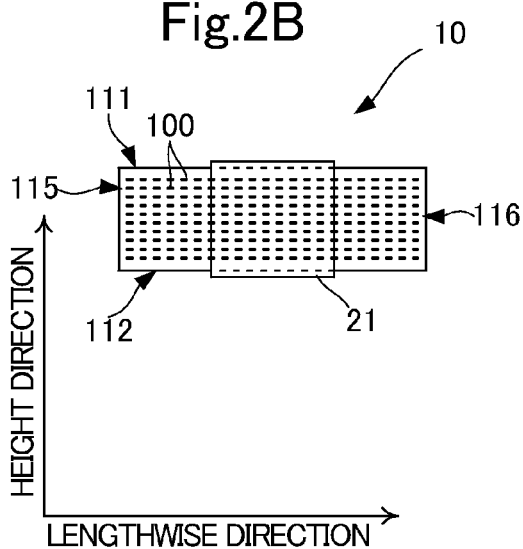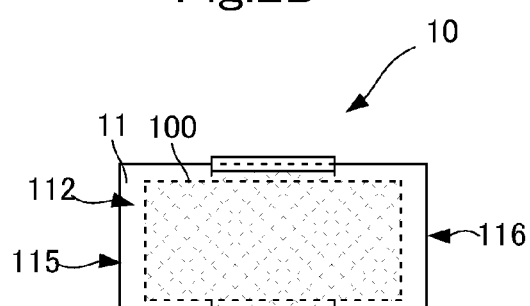

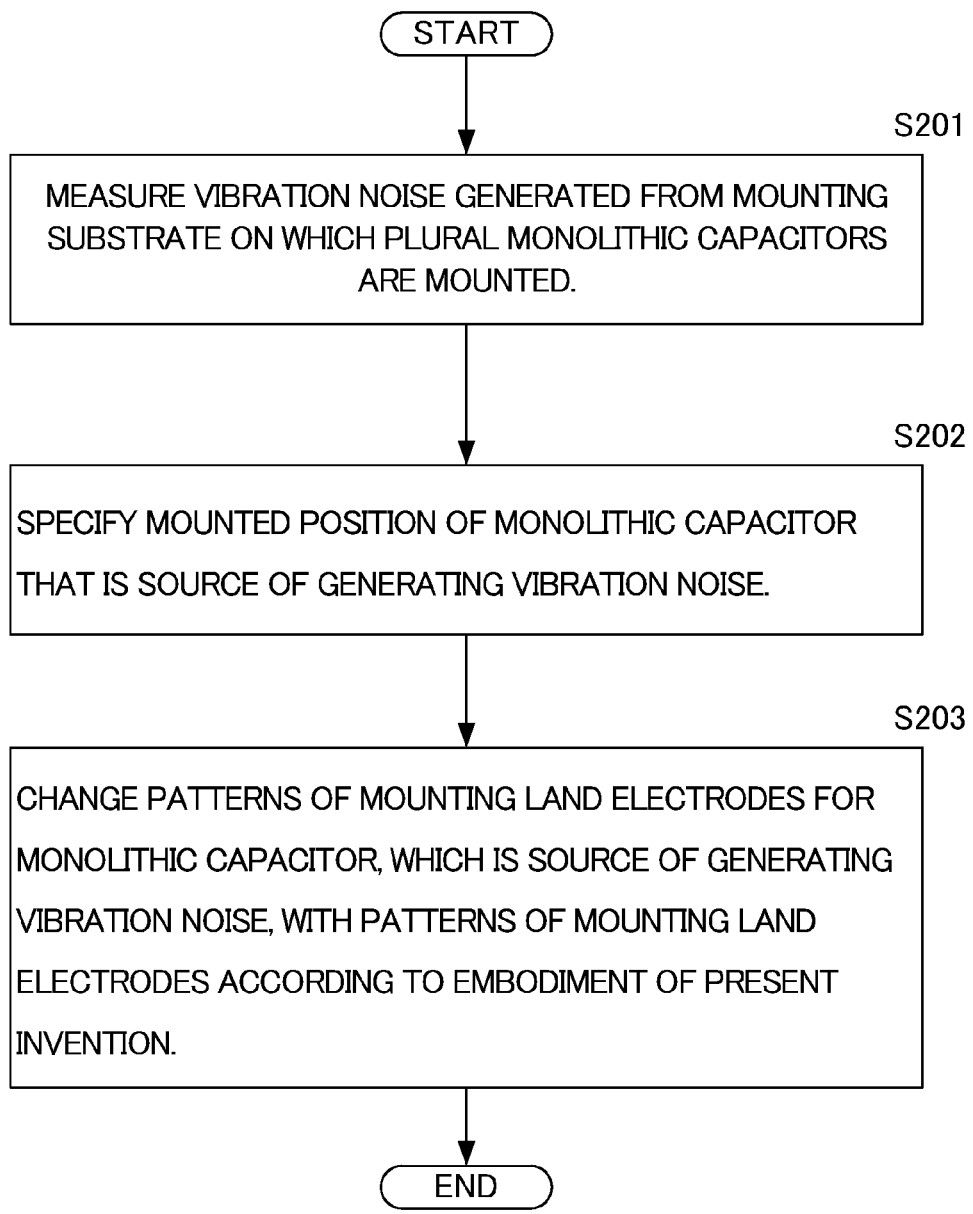

MONOLITHIC CAPACITOR MOUNTING STRUCTURE AND MONOLITHIC CAPACITOR

CROSS REFERENCE

This non-provisional application claims priority under 35 U.S.C. §119(a) to Patent Application No. 2012-177638 filed in Japan on Aug. 10, 2012, and Patent Application No. 2012-177639 filed in Japan on Aug. 10, 2012, the entire contents of which are hereby incorporated by reference.

BACKGROUND OF THE INVENTION

1. Field of the Invention

The present invention relates to a mounting structure of a monolithic capacitor including outer electrodes on an elementary body that includes dielectric layers and inner electrodes, which are alternately stacked, and also relates to a monolithic capacitor mounted in the mounting structure.

2. Description of the Related Art

At present, monolithic capacitors are widely utilized in various electronic devices, including cellular phones and other mobile terminals, personal computers, etc. The monolithic capacitor includes an elementary body having a substantially rectangular parallelepiped shape and functioning as a capacitor. The elementary body has a structure in which dielectric layers and electrodes (inner electrodes), each being in the form of a flat plate, are alternately stacked. That type of monolithic capacitor includes outer electrodes connected to the inner electrodes. The outer electrodes are generally formed at both ends of the elementary body in the lengthwise direction thereof, respectively.

The above-described monolithic capacitor is electrically and physically connected to a circuit board of an electronic device by directly placing the outer electrodes on mounting lands of the circuit board, and by bonding the mounting lands and the outer electrodes to each other using a bonding material, e.g., solder.

When an AC voltage or a DC voltage superimposed with an AC voltage is applied to the monolithic capacitor, vibration is generated with mechanical distortion due to the piezoelectric or electrostrictive effect. In particular, when a ceramic having a high dielectric constant, such as barium titanate, is used as a dielectric of the monolithic capacitor, the vibration caused by mechanical distortion of the monolithic capacitor is increased. When the vibration is generated in the monolithic capacitor, the generated vibration is transmitted to the circuit board, thus causing the circuit board to vibrate. The vibration of the circuit board may cause vibration noise that is perceptible by the human ear.

To solve the above-mentioned problem, Japanese Unexamined Patent Application Publication No. 8-55752, for example, discloses the following technique. A monolithic capacitor is mounted to a substrate in such a state that surfaces of inner electrodes are oriented perpendicularly to the surface of the substrate. With such an arrangement, even when dielectric ceramics vibrate upon application of a voltage while repeating expansion and restoration in the direction of thickness thereof (i.e., the direction in which the inner electrodes are stacked), the vibration is not directly transmitted to the substrate, whereby vibration noise can be reduced.

However, the monolithic capacitor vibrates not only in the direction of thickness thereof, but also in the planar direction of each inner electrode. Therefore, even when the arrangement disclosed in Japanese Unexamined Patent Application Publication No. 8-55752 is employed, the vibration is not reduced depending on the types of circuit boards.

SUMMARY OF THE INVENTION

Preferred embodiments of the present invention provide a monolithic capacitor mounting structure and a monolithic capacitor mounted in the mounting structure, which significantly reduces and prevents generation of vibration noise.

According to one preferred embodiment of the present invention, a monolithic capacitor mounting structure includes a monolithic capacitor including an elementary body having a parallelepiped shape or a substantially parallelepiped shape and defined by plural dielectric layers and plural inner electrodes, which are alternately stacked, a first outer electrode located on a first side surface, extending in a lengthwise direction, of the elementary body, and a second outer electrode located on a second side surface, extending in the lengthwise direction, of the elementary body, a mounting substrate including an insulating substrate, a first land electrode disposed on a surface of the insulating substrate and connected to the first outer electrode, and a second land electrode disposed on the surface of the insulating substrate and connected to the second outer electrode, a first bonding material arranged to bond the first outer electrode and the first land electrode, and a second bonding material arranged to bond the second outer electrode and the second land electrode.

Assuming that a portion of the first outer electrode, the portion being joined with the first bonding material, is a first bonding portion and a portion of the second outer electrode, the portion being joined with the second bonding material, is a second bonding portion, a length of each of the first and second bonding portions in the lengthwise direction is, for example, about 0.2 times to about 0.5 times a length of the elementary body in the lengthwise direction, and a center of each of the first and second bonding portions in the lengthwise direction is located at a position different from a center of the elementary body in the lengthwise direction.

In accordance with various preferred embodiments of the present invention, vibration noise can be changed depending on positions of the outer electrodes of the monolithic capacitor, at which the monolithic capacitor is bonded to the mounting substrate.

With the arrangement according to one preferred embodiment of the present invention, by specifying shapes and positions of the bonding portions as described above, the monolithic capacitor can be mounted to the mounting substrate except at regions where the volume of the elementary body is apt to change due to the piezoelectric or electrostrictive effect. As a result, generation of the vibration noise can be significantly reduced or prevented.

In the monolithic capacitor mounting structure according to the one preferred embodiment of the present invention, the length of each of the first and second bonding portions in the lengthwise direction may be within a range of about 0.4±0.05 times the length of the elementary body in the lengthwise direction, for example.

With the above-described arrangement, the monolithic capacitor is mounted to the mounting substrate in regions where volume change of the elementary body is relatively unlikely to occur. As a result, the generation of the vibration noise is significantly reduced or prevented.

Preferably, the first and second bonding portions extending in the lengthwise direction are arranged such that ends of each of the first and second bonding portions in the lengthwise direction are positioned within a range of about 0.25 times the length of the elementary body in the lengthwise direction from the center of the elementary body in the lengthwise direction, for example.

Furthermore, in the monolithic capacitor mounting structure according to the one preferred embodiment of the present invention, a distance between the center of each of the first bonding portion and the second bonding portion in the lengthwise direction and the center of the elementary body in the lengthwise direction is preferably within a range of about 0.1±0.05 times the length of the elementary body in the lengthwise direction, for example.

These arrangements can significantly reduce or prevent the generation of the vibration noise.

According to other preferred embodiments of the present invention, shapes and positions of the first and second outer electrodes, or shapes and positions of the first and second land electrodes may be adjusted in order to set the shapes and the positions of the first and second bonding portions as described above.

In addition, the present invention is not limited to monolithic capacitor mounting structure, and other preferred embodiments of the present invention include a monolithic capacitor mounted in the above-described mounting structure.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is an external perspective view of a monolithic capacitor to be mounted in a mounting structure according to a first preferred embodiment of the present invention.

FIGS. 2A, 2B, 2C, and 2D are four orthogonal views of the monolithic capacitor to be mounted in the mounting structure according to the first preferred embodiment of the present invention.

FIG. 15 is a flowchart illustrating a method for reducing the vibration noise generated from a mounting substrate in accordance with a preferred embodiment of the present invention.

DETAILED DESCRIPTION OF THE PREFERRED EMBODIMENTS

A monolithic capacitor to be mounted in a mounting structure according to preferred embodiments of the present invention will be described below with reference to the drawings.

Figure 3:
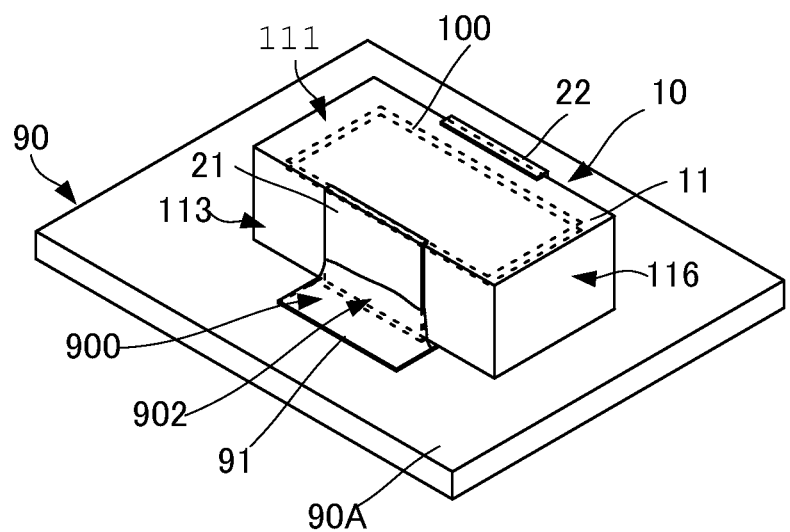
FIG. 3 is a perspective view of the monolithic capacitor in a state mounted in the mounting structure according to the first preferred embodiment of the present invention.

FIG. 1 is an external perspective view of a monolithic capacitor 10 to be mounted in the mounting structure according to the first preferred embodiment of the present invention. FIGS. 2A, 2B, 2C, and 2D are four orthogonal views of the monolithic capacitor 10 to be mounted in the mounting structure according to the first preferred embodiment. FIG. 3 is a perspective view of the monolithic capacitor 10 in a state mounted in the mounting structure according to the first preferred embodiment.

The monolithic capacitor 10 preferably includes an elementary body 11, one first outer electrode 21, and one second outer electrode 22. The elementary body 11 preferably has a rectangular parallelepiped shape or a substantially rectangular parallelepiped shape extending in a lengthwise direction, a widthwise direction, and a height direction. Hereinafter, a length of the elementary body 11 in the lengthwise direction is denoted by LC, and a width of the elementary body 11 in the widthwise direction is denoted by LCw.

The elementary body 11 is defined by alternately stacking dielectric layers and inner electrodes 100. The dielectric layers and the inner electrodes 100 are preferably each in the form of a rectangular or substantially rectangular flat plate. The dielectric layers are each made of, e.g., a ceramic material, and the inner electrode 100 are each made of, e.g., copper (Cu).

Surfaces of the elementary body 11 extending parallel or substantially parallel to the lengthwise direction perpendicularly or substantially perpendicularly to a stacking direction of the dielectric layers and the inner electrodes 100 serve as a top surface 111 and a bottom surface 112 of the elementary body 11. Surfaces of the elementary body 11 extending parallel or substantially parallel to the lengthwise direction and parallel or substantially parallel to the stacking direction of the dielectric layers and the inner electrodes 100 serve as a first lengthwise side surface 113 and a second lengthwise side surface 114 of the elementary body 11. Surfaces of the elementary body 11 extending perpendicularly or substantially perpendicularly to the lengthwise direction, i.e., surfaces of the elementary body 11 extending parallel or substantially parallel to the widthwise direction, serve as a first widthwise side surface 115 and a second widthwise side surface 116 of the elementary body 11.

Each inner electrode 100 preferably includes a connecting portion 100m in which an electrode end is exposed to the first lengthwise side surface 113, or a connecting portion 100n in which an electrode end is exposed to the second lengthwise side surface 114. For example, the inner electrode 100 including the connecting portion 100m and the inner electrode 100 including the connecting portion 100n are alternately stacked with the dielectric layer interposed between them.

The inner electrodes 100 are not exposed to the first widthwise side surface 115 and the second widthwise side surface 116.

The first outer electrode 21 is preferably arranged at or substantially at a center of the first lengthwise side surface 113 of the elementary body 11. The second outer electrode 22 is preferably arranged at or substantially at a center of the second lengthwise side surface 114 of the elementary body 11. The first outer electrode 21 and the second outer electrode 22 preferably have the same length in the lengthwise direction. A length LD of each of the first and second outer electrodes 21 and 22 in the lengthwise direction is preferably shorter than the length LC of the elementary body 11 in the lengthwise direction.

The first outer electrode 21 and the second outer electrode 22 are preferably defined over a full height of the first and second lengthwise side surfaces 113 and 114 in the height direction thereof, respectively. In addition, the first outer electrode 21 and the second outer electrode 22 are preferably arranged so as to extend in partly covering relation to the top surface 111 and the bottom surface 112.

The monolithic capacitor 10 having the above-described structure is preferably mounted to a mounting substrate 90, as illustrated in FIG. 3.

The mounting substrate 90 includes an insulating substrate 90A in the form of a flat or substantially flat plate.

The insulating substrate 90A is preferably made of, e.g., a glass epoxy resin substrate, such as FR-4, for example. A pair of land electrodes 91 is defined on one principal surface (front surface) of the insulating substrate 90A.

The monolithic capacitor 10 is mounted to the mounting substrate 90 by bonding the first outer electrode 21 to one of the land electrodes 91 and bonding the second outer electrode 22 to the other land electrode 91. The bonding is preferably performed using, e.g., a solder 900.

A first bonding portion 902 is a portion of the first outer electrode 21, preferably provided on the side surface 113, where the first outer electrode 21 is joined with the solder 900.

A second bonding portion (not shown, but identical or substantially identical to the first bonding portion 902) is a portion of the second outer electrode 22, preferably provided on the side surface 114, where the second outer electrode 22 is joined with the solder 900.

With the bonding using the solder 900, the monolithic capacitor 10 is mounted to the mounting substrate 90 through the first bonding portion 902 and the second bonding portion.

The monolithic capacitor 10 having the above-described structure causes distortion due to a voltage applied thereto. At least one of the preferred embodiments of the present invention is able to obtain the following results by analyzing the distortion of the monolithic capacitor 10 caused due to the applied voltage.

Figure 4:
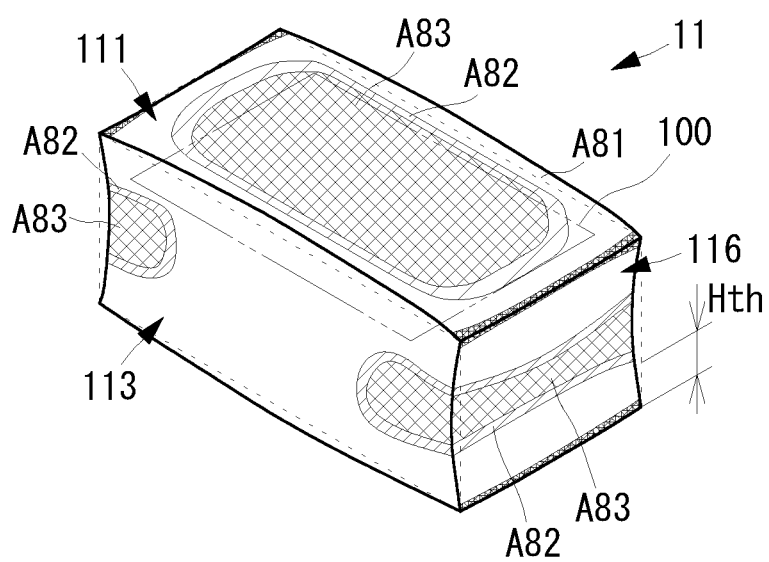
FIG. 4 illustrates a distortion distribution caused by applying a voltage to a monolithic ceramic capacitor according to a preferred embodiment of the present invention.

FIG. 4 illustrates a distortion distribution caused by applying a voltage to the monolithic capacitor 10. In FIG. 4, A81, A82, and A83 represent regions partitioned depending on an amount of distortion. A relation in magnitude of the distortion amount among those regions is given by A81<A82<A83. In other words, A81 represents the region where the distortion is least likely to occur, and A83 represents the region where the distortion is most likely to occur.

As illustrated in FIG. 4, when a predetermined voltage is applied to the monolithic capacitor 10, the top surface 111 and the bottom surface 112 are entirely distorted, and the distortion increases toward their central regions. On the other hand, the distortion is relatively small in regions near centers of respective edges of the top surface 111 and the bottom surface 112, the edges adjoining to the first and second lengthwise side surfaces 113 and 114.

Furthermore, the distortion is increased near respective both edges of the first and second lengthwise side surfaces 113 and 114 of the monolithic capacitor 10 in the lengthwise direction, i.e., near respective both edges of the first and second lengthwise side surfaces 113 and 114, the edges adjoining to the first and second widthwise side surfaces 115 and 116. On the other hand, the distortion is relatively small in regions near respective centers of the first and second lengthwise side surfaces 113 and 114 of the monolithic capacitor 10 in the lengthwise direction.

Moreover, the distortion is increased in respective central regions, as viewed in the height direction, of both end surfaces of the monolithic capacitor 10 in the lengthwise direction (i.e., of the first and second widthwise side surfaces 115 and 116). The distortion is relatively small in bottom regions of the first and second widthwise side surface 115 and 116, the heights of the bottom regions from the bottom surface 112 being height "Hth".

Based on the foregoing results, according to the first preferred embodiment of the present invention, the first and second outer electrodes 21 and 22 are arranged at or substantially at the centers of the first and second lengthwise side surfaces 113 and 114 of the elementary body 11 in the lengthwise direction, as described above. With such an arrangement, the first and second outer electrodes 21 and 22 are positioned in the regions of the monolithic capacitor 10 where the distortion is small. In other words, the monolithic capacitor 10 is mounted to the mounting substrate 90 through the first bonding portion 902 and the second bonding portion in the regions of the monolithic capacitor 10 where the distortion is small. Accordingly, vibration attributable to the distortion is hardly generated in the mounting substrate 90, and the generation of vibration noise can be greatly reduced or prevented.

Figure 5:
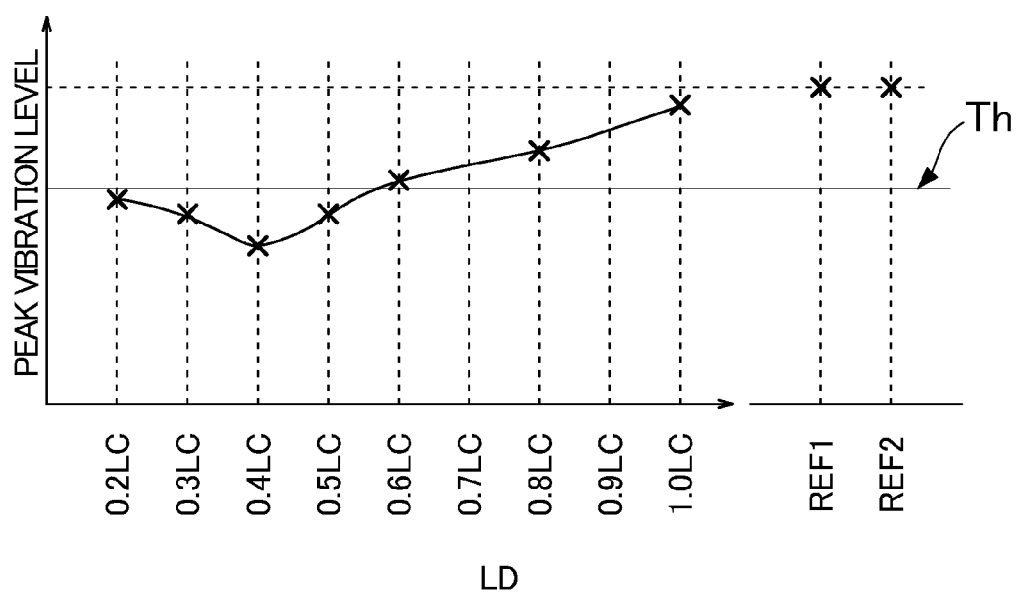
FIG. 5 is a graph representing a vibration noise suppression effect of the monolithic capacitor mounted in the mounting structure according to the first preferred embodiment of the present invention.

Here, the length LD of each of the first and second outer electrodes 21 and 22 is preferably within the range discussed below. FIG. 5 is a graph representing the correlation between a ratio of the length LD of each of the first and second outer electrodes 21 and 22 to the length LC of the elementary body 11 and a peak vibration level. In FIG. 5, 0.2 LC implies that the length LD of each of the first and second outer electrodes 21 and 22 is preferably about 0.2 times the length LC of the elementary body 11, for example. Furthermore, FIG. 5 represents the case where a center of the elementary body 11 in the lengthwise direction is aligned with a center of each of the first and second outer electrodes 21 and 22 in the lengthwise direction.

Additionally, in FIG. 5, REF1 represents the case where outer electrodes are defined on both end surfaces (corresponding to the first and second widthwise side surfaces 115 and 116) of an elementary body in the lengthwise direction thereof (i.e., the case of a general arrangement of a related-art monolithic capacitor). In that arrangement, the outer electrodes extend so as to partially cover a top surface, a bottom surface, and both lengthwise side surfaces of the elementary body from both the end surfaces of the elementary body in the lengthwise direction. REF2 represents the case where outer electrodes are defined on entire lengthwise side surfaces of an elementary body, and the outer electrodes are each arranged to partially cover a top surface, a bottom surface, and both widthwise side surfaces of the elementary body from both the lengthwise side surfaces of the elementary body. Moreover, FIG. 5 represents the result on condition that the length LC of the elementary body 11 in the lengthwise direction is 1.0 mm (i.e., LC=1.0 mm), the width LCw of the elementary body 11 in the widthwise direction is about 0.5 mm (i.e., LCw=0.5 mm), and the height of the elementary body 11 is about 0.5 mm, for example.

As seen from FIG. 5, the peak vibration level can be reduced in comparison with the cases of REF1 and REF2 by setting the length LD of each of the first and second outer electrodes 21 and 22 to be shorter than the length LC of the elementary body 11, and by arranging the first and second outer electrodes 21 and 22 at the center of the elementary body 11 in the lengthwise direction.

In addition, as seen from FIG. 5, the peak vibration level has a minimum value with respect to the ratio of the length LD of each of the first and second outer electrodes 21 and 22 to the length LC of the elementary body 11. In more detail, as illustrated in FIG. 5, the peak vibration level has a minimum value at LD=(0.4±0.05)×LC, i.e., when the length LD of each of the first and second outer electrodes 21 and 22 is about 0.4 times the length LC of the elementary body 11, for example. Furthermore, a range where the vibration attributable to the distortion can be regarded as sufficiently small exists within a range of predetermined length LD including 0.4 LC and thereabout at which the minimum value is obtained. More specifically, that range is given as a range where the peak vibration level illustrated in FIG. 5 is smaller than a reduced value Th, i.e., a range where the length LD of each of the first and second outer electrodes 21 and 22 is about 0.2 to about 0.5 times the length LC of the elementary body 11, for example. In the first preferred embodiment, the reduced value Th is set to −10 dB of the peak vibration level in the cases of REF1 and REF2. The reduced value Th can be increased or decreased depending on the situation in use of the monolithic capacitor, but a more satisfactory result is obtained by setting the reduced value Th to −10 dB.

Thus, the vibration can be greatly reduced by setting the length LD of each of the first and second outer electrodes 21 and 22 to fall in the range of about 0.2 to about 0.5 times the length LC of the elementary body 11, for example. The vibration can be reduced to a larger extent by setting the length LD of each of the first and second outer electrodes 21 and 22 to be about 0.4 times the length LC of the elementary body 11, for example.

Figure 6:
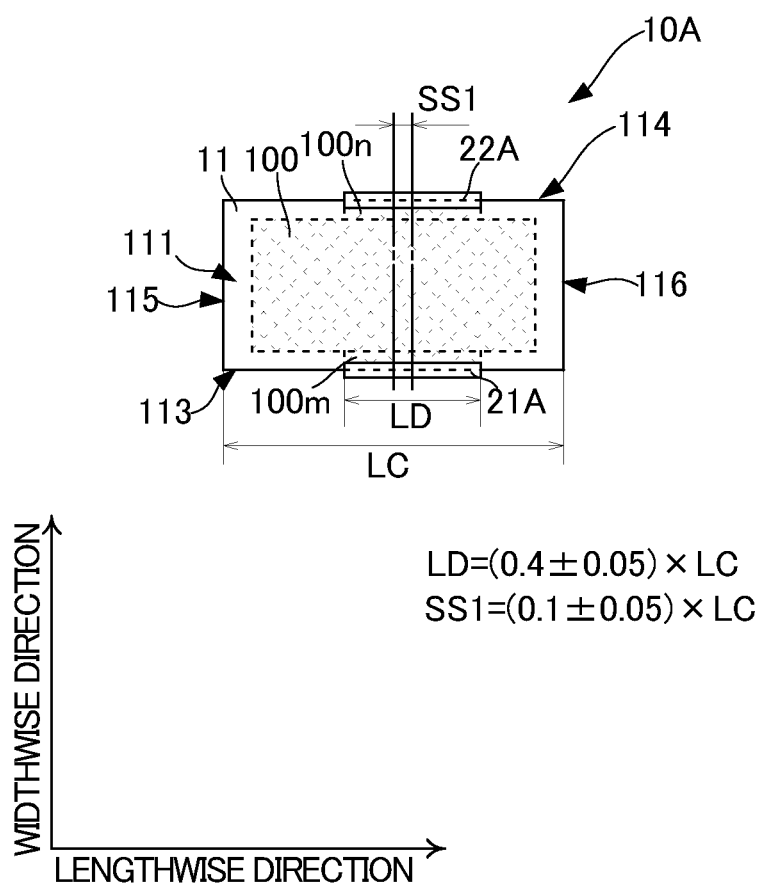
FIG. 6 is an external perspective view of a monolithic capacitor to be mounted in a mounting structure according to a second preferred embodiment of the present invention.

A monolithic capacitor to be mounted in a mounting structure according to a second preferred embodiment of the present invention will be described below with reference to the drawings. FIG. 6 is a plan view of a monolithic capacitor 10A to be mounted in the mounting structure according to the second preferred embodiment of the present invention. The monolithic capacitor 10A according to the second preferred embodiment is different from the monolithic capacitor 10 according to the first preferred embodiment in that the positions of the first and second outer electrodes 21A and 22A in the lengthwise direction of the elementary body 11 are preferably shifted (displaced). The other arrangement is preferably the same as that of the monolithic capacitor 10 to be mounted in the mounting structure according to the first preferred embodiment, and detailed description of the other arrangement is omitted here.

In the monolithic capacitor 10A illustrated in FIG. 6, centers of first and second outer electrodes 21A and 22A are preferably shifted from the center of the elementary body 11 in the lengthwise direction. An amount SS1 of such center shift is about 0.1±0.05 times the length LC of the elementary body 11, for example.

Figure 7:
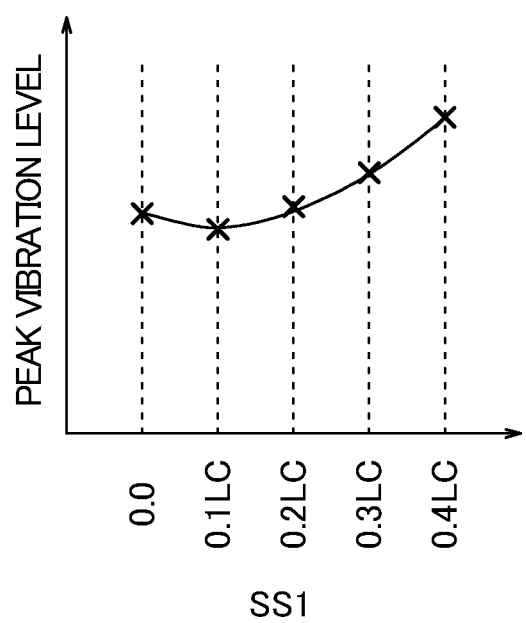
FIG. 7 is a graph representing a vibration noise suppression effect of the monolithic capacitor mounted in the mounting structure according to the second preferred embodiment of the present invention.

FIG. 7 is a graph representing the correlation between a ratio of the shift amount SS1 of each of the first and second outer electrodes 21A and 22A to the length LC of the elementary body 11 and a peak vibration level. FIG. 7 represents the result in the case where the length LD of each of the first and second outer electrodes 21A and 22A is about 0.2 times the length LC of the elementary body 11, for example.

As seen from FIG. 7, the peak vibration level has a minimum value with respect to the ratio of the shift amount SS1 of each of the first and second outer electrodes 21A and 22A to the length LC of the elementary body 11. In more detail, as illustrated in FIG. 7, the peak vibration level has a minimum value at SS1=(0.1±0.05)×LC, i.e., when the shift amount SS1 of each of the first and second outer electrodes 21A and 22A from the center position of the elementary body 11 in the lengthwise direction is about 0.1 times the length LC of the elementary body 11, for example.

Accordingly, the vibration can be reduced to a larger extent by setting the shift amount SS1 of each of the first and second outer electrodes 21A and 22A to be about 0.1 times the length LC of the elementary body 11, for example.

In addition, the arrangement (shapes and sizes) of the first and second outer electrodes may preferably be specified as follows, based on both the results of FIGS. 5 and 7.

As seen from FIG. 5, the vibration noise is reduced when the length LD of each of the first and second outer electrodes is not more than about 0.5 times the length LC of the elementary body 11, for example.

As seen from FIG. 7, the vibration noise is also reduced by shifting the center of each of the first and second outer electrodes in the lengthwise direction from the center of the elementary body 11 in the lengthwise direction within the range of about 0.15 times the length LC of the elementary body 11, for example.

In consideration of the results described above, the ends of each of the first and second outer electrodes in the lengthwise direction are preferably arranged to position within the range of about 0.25 times the length LC of the elementary body 11 from the center of the elementary body 11 in the lengthwise direction, for example. With such an arrangement, the vibration noise can be reduced to a level not higher than a level obtained in the case where the center of each of the first and second outer electrodes in the lengthwise direction is set in alignment with the center of the elementary body and the length LD of each of the first and second outer electrodes and is preferably set to be about 0.5 times the length LC of the elementary body 11, for example.

Accordingly, the first and second outer electrodes are preferably arranged such that the ends of each of the first and second outer electrodes in the lengthwise direction are positioned within the range of about 0.25 times the length LC of the elementary body 11 from the center of the elementary body 11 in the lengthwise direction, for example.

While preferred embodiments of the present invention have been described above in connection with an example in which the first and second outer electrodes are formed over the full height of the first and second lengthwise side surfaces, the first and second outer electrodes may each be arranged to extend until an intermediate position in the height direction from the bottom surface 112 of the elementary body 11.

Furthermore, the first and second outer electrodes may have shapes which do not extend in a partly covering relationship with the top surface of the elementary body.

When the first and second outer electrodes have shapes extending in a partly covering relationship with the top surface and the bottom surface of the elementary body, the vibration noise can be suppressed by setting an amount of the coverage to be as small as possible, taking into account reliability of the mounting. For example, the coverage amount is preferably set such that the first and second outer electrodes will not overlap with a region where the inner electrodes 100 layered in the stacking direction are opposed to each other, when looking at the elementary body 11 from above (i.e., when viewed in the direction perpendicular or substantially perpendicular to the top surface 111).

Figure 8:
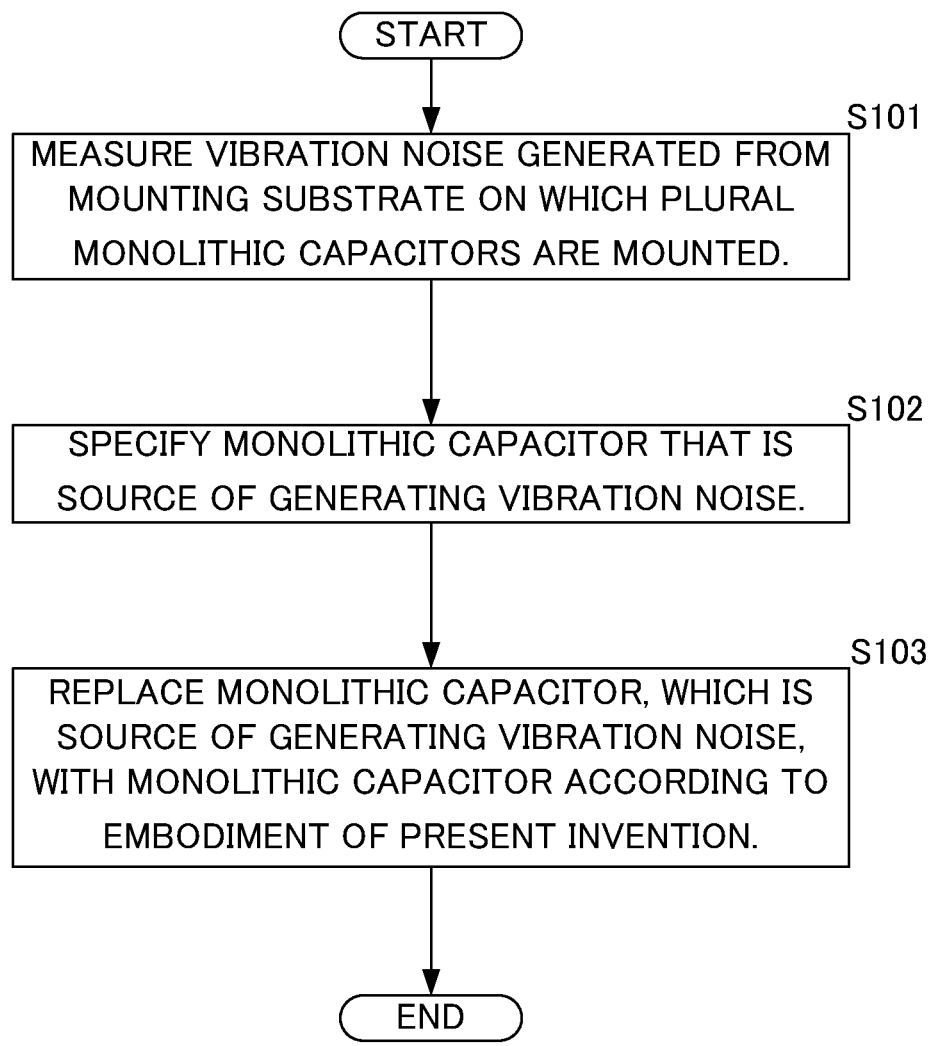
FIG. 8 is a flowchart illustrating a method for reducing vibration noise generated from a mounting substrate in accordance with a preferred embodiment of the present invention.

The vibration noise can preferably be more effectively reduced by using the monolithic capacitor having the above-described structure as follows. FIG. 8 is a flowchart illustrating a method for reducing the vibration noise generated from the mounting substrate in accordance with a preferred embodiment of the present invention.

Vibration noise generated from a mounting substrate including a plurality of monolithic capacitors mounted thereon is measured (S101). The vibration noise can be measured, for example, by a method of directly measuring the vibration noise with a microphone, a method of indirectly measuring the vibration noise by measuring vibration with a laser Doppler vibration meter, etc.

When the vibration noise exceeds a predetermined threshold, a monolithic capacitor that is a source of generating the vibration noise is specified (S102).

The monolithic capacitor that is the source of generating the vibration noise is replaced with the monolithic capacitor according to the preferred embodiment of the present invention (S103). At that time, when positions where land electrodes arranged to mount the monolithic capacitor are configured differently from the positions of the first and second outer electrodes according to the preferred embodiments of the present invention, intermediate substrates arranged to connect the land electrodes and the first and second outer electrodes may be provided, or intermediate electrode patterns may be defined on the mounting substrate, for example. As an alternative, when possible, patterns of the land electrodes on the mounting substrate may be modified. It is to be noted that the threshold for the vibration noise is defined depending on, e.g., the intended use of an electronic device used in practice.

The vibration noise which was generated prior to the replacement of the monolithic capacitor can be reduced by utilizing the above-described method. An effect of the method of reducing the vibration noise, illustrated in FIG. 8, is experimentally proved for the case using a monolithic capacitor with a length LC=1.0 mm in the lengthwise direction, a width LCw=0.5 mm in the widthwise direction, and a height of 0.5 mm, for example. However, the above-described method can also be applied to monolithic capacitors having other dimensions.

In the monolithic capacitor mounting structures according to the first and second preferred embodiments of the present invention, as described above, the vibration of the mounting substrate is significantly reduced or prevented based on at least one of the relationship between the length LD of each of the first and second outer electrodes and the length LC of the elementary body 11, and the relationship between the center position of the elementary body 11 in the lengthwise direction and the center position of each of the first and second outer electrodes in the lengthwise direction. Even with the length and the center position of each of the first and second outer electrodes being held fixed, however, the vibration of the mounting substrate can also be significantly reduced or prevented based on at least one of the relationship between a length of each of the first bonding portion 902 and the second bonding portion in the lengthwise direction and the length LC of the elementary body 11, and the relationship between the center position of the elementary body 11 in the lengthwise direction and a center position of each of the first bonding portion 902 and the second bonding portion in the lengthwise direction.

For example, a length of each land electrode in the lengthwise direction may be changed such that the relationship between the length of each of the first bonding portion 902 and the second bonding portion in the lengthwise direction and the length LC of the elementary body 11 satisfies the above-described condition, and each land electrode may be shifted such that the relationship between the center position of the elementary body 11 in the lengthwise direction and the center position of each of the first bonding portion 902 and the second bonding portion in the lengthwise direction satisfies the above-described condition. In more detail, such a modification may be practiced as follows.

Figure 9:
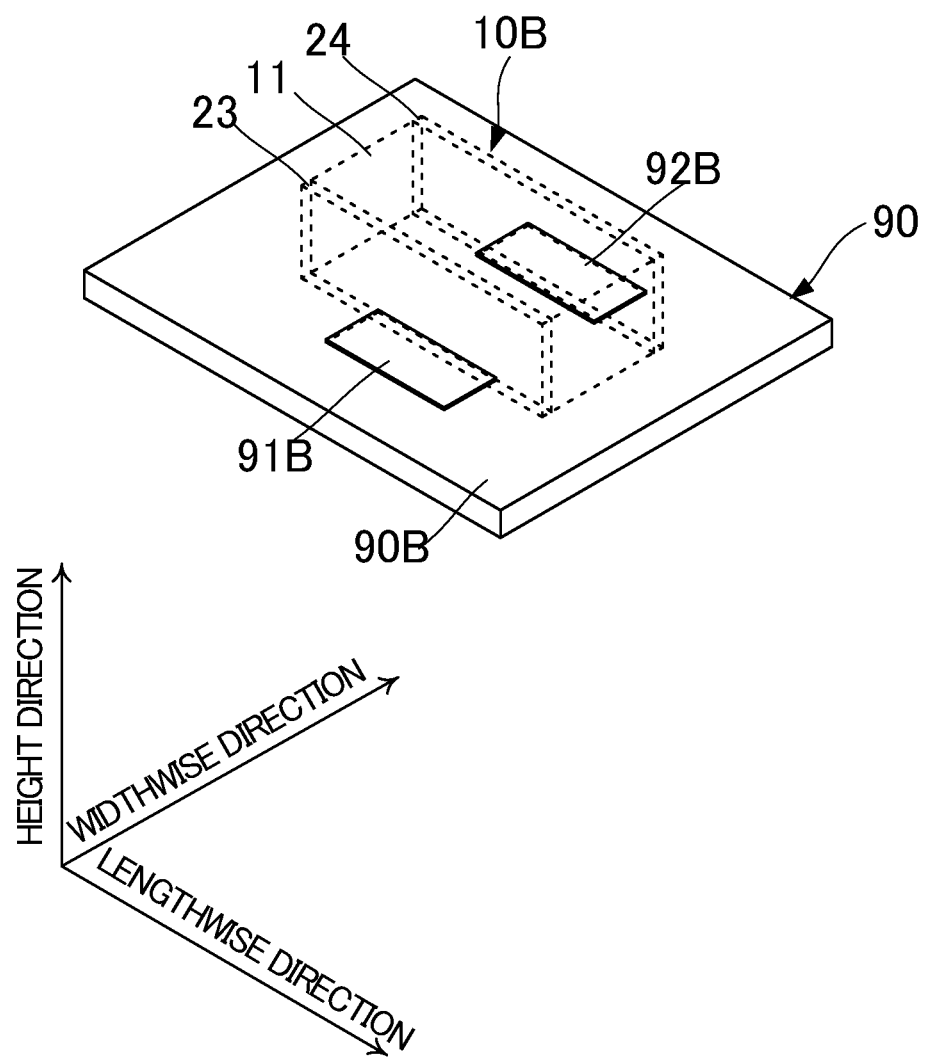
FIG. 9 is an external perspective view of a mounting substrate in the mounting structure according to a third preferred embodiment of the present invention.
Figure 10A:
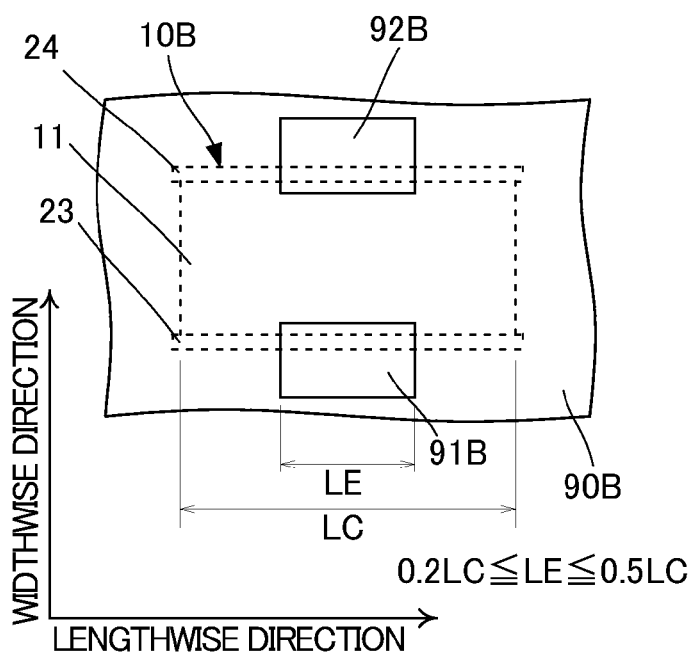
FIGS. 10A, 10B, and 10C are three orthogonal views of the mounting substrate in the mounting structure according to the third preferred embodiment of the present invention.
Figure 10C:
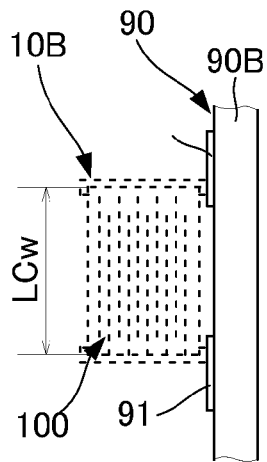
Figure 10B:
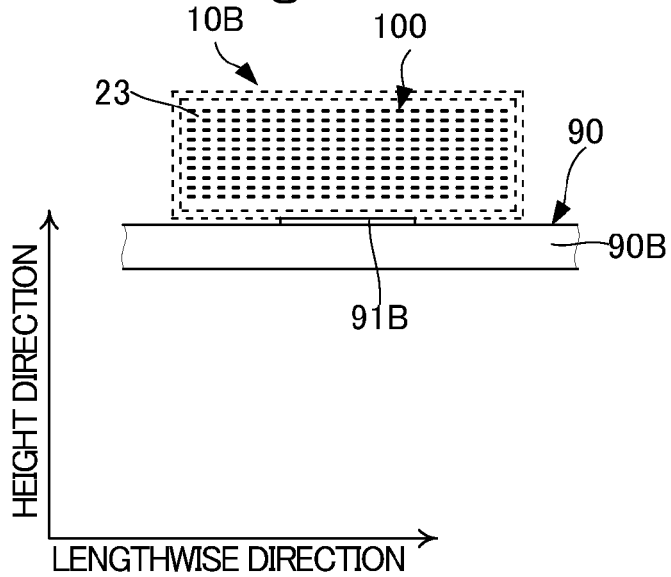
Figure 11:
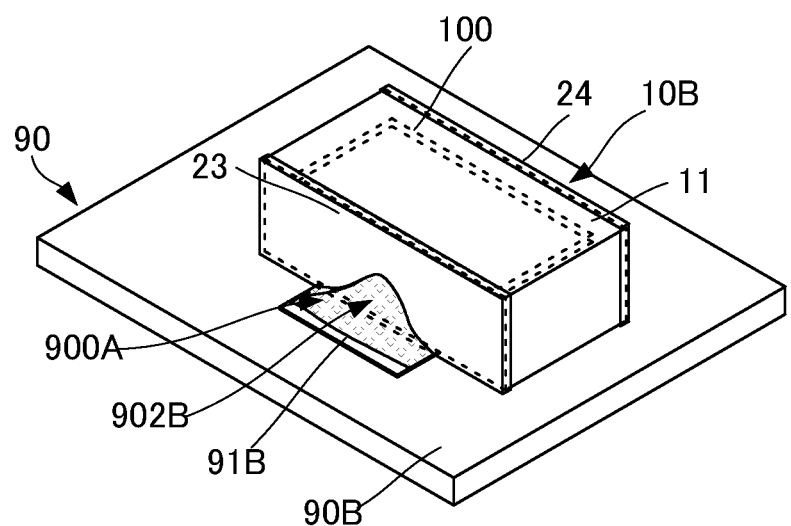
FIG. 11 is a perspective view illustrating a state in which a monolithic capacitor is mounted to the mounting substrate in the mounting structure according to the third preferred embodiment of the present invention.

A monolithic capacitor mounting structure according to a third preferred embodiment of the present invention will be described below with reference to the drawings. FIG. 9 is an external perspective view of a mounting substrate 90 in the mounting structure according to the third preferred embodiment. FIGS. 10A, 10B, and 10C are three orthogonal views of the mounting substrate 90 in the mounting structure according to the third preferred embodiment. FIG. 11 is a perspective view illustrating a state in which a monolithic capacitor 10B is mounted to the mounting substrate 90 in the mounting structure according to the third preferred embodiment.

The monolithic capacitor mounting structure according to the third preferred embodiment is preferably different from the monolithic capacitor mounting structure according to the first preferred embodiment in shapes of the first and second outer electrodes and shapes of the land electrodes. The other structure is the same and description thereof is omitted here.

The mounting substrate 90 preferably includes an insulating substrate 90B in the shape of a flat or substantially flat plate. Land electrodes 91B and 92B are preferably defined on one principal surface (front surface) of the insulating substrate 90B. The land electrode 91B is an electrode to which a first outer electrode 23 of the monolithic capacitor 10B is bonded. The land electrode 92B is an electrode to which a second outer electrode 24 of the monolithic capacitor 10B is bonded.

The first outer electrode 23 is defined on the first lengthwise side surface, extending in the lengthwise direction, of the elementary body 11. The second outer electrode 24 is defined on the second lengthwise side surface, extending in the lengthwise direction, of the elementary body 11. The first outer electrode 23 and the second outer electrode 24 are preferably arranged over the entire first and second lengthwise side surfaces, respectively.

The monolithic capacitor 10B having the above-described structure is mounted to the mounting substrate 90, as illustrated in FIG. 11. More specifically, the first outer electrode 23 is preferably bonded to the land electrode 91B using a solder 900, and the second outer electrode 24 is preferably bonded to the land electrode 92B using a solder 900, such that the monolithic capacitor 10B is mounted to a predetermined region of the mounting substrate 90.

A first bonding portion 902B is a portion of the first outer electrode 23 where the first outer electrode 23 is joined with the solder 900. A second bonding portion (not shown, but identical or substantially identical to the first bonding portion

902B) is a portion of the second outer electrode 24 where the second outer electrode 24 is joined with the solder 900.

As a result of the bonding using the solder 900, the monolithic capacitor 10B is mounted to the mounting substrate 90 through the first bonding portion 902B and the second bonding portion.

Even with the arrangement described above, the monolithic capacitor 10B is mounted, in its regions where the distortion is small, to the mounting substrate 90 through the first bonding portion 902B and the second bonding portion.

Furthermore, the land electrodes 91B and 92B preferably have sizes described below. It is assumed that a length of each of the land electrodes 91B and 92B in the lengthwise direction is LE.

Figure 12:
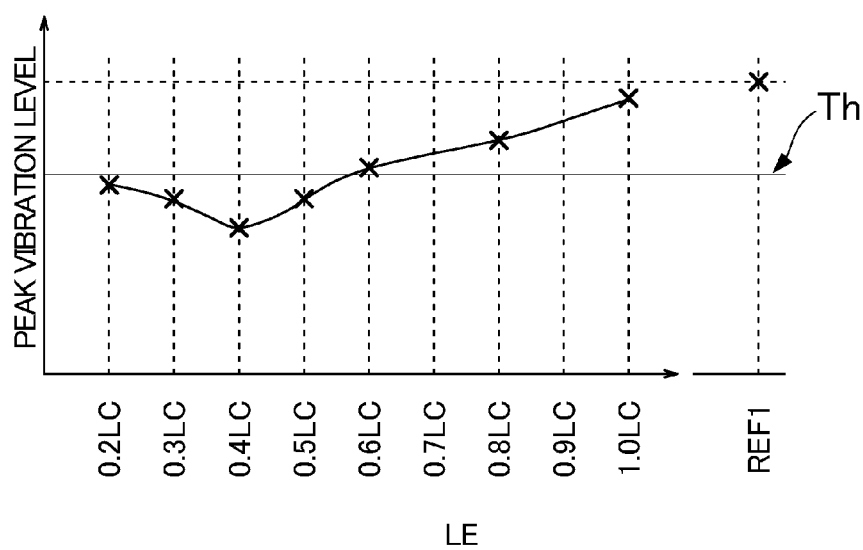
FIG. 12 is a graph representing a vibration noise suppression effect of the mounting substrate in the mounting structure according to the third preferred embodiment of the present invention.

FIG. 12 is a graph representing the correlation between a ratio of the length LE of each of the land electrodes 91B and 92B to the length LC of the elementary body 11 and a peak vibration level. FIG. 12 represents the case where the center of the elementary body 11 in the lengthwise direction is aligned with a center of each of the land electrodes 91B and 92B in the lengthwise direction.

It is to be noted that, in FIG. 12, REF1 represents the same case as that represented by REF1 in FIG. 5. Moreover, FIG. 12 represents the result in the case where the elementary body 11 has the same dimensions as those of the elementary body 11 in FIG. 5.

As seen from FIG. 12, the peak vibration level can be reduced in comparison with the case of REF1 by setting the length LE of each of the land electrodes 91B and 92B to be shorter than the length LC of the elementary body 11, and by arranging the land electrodes 91B and 92B at the center of the elementary body 11 in the lengthwise direction.

In addition, as seen from FIG. 12, the peak vibration level preferably has a minimum value with respect to the ratio of the length LE of each of the land electrodes 91B and 92B to the length LC of the elementary body 11. In more detail, as illustrated in FIG. 12, the peak vibration level has a minimum value at LE=$(0.4\pm0.05)\times$LC, i.e., when the length LE of each of the land electrodes 91B and 92B preferably is about 0.4 times the length LC of the elementary body 11, for example. Furthermore, a range where the vibration attributable to the distortion can be regarded as sufficiently small is within a range of predetermined length LE including 0.4 LC and thereabout at which the minimum value is obtained. More specifically, that range is given as a range where the peak vibration level illustrated in FIG. 12 is smaller than a reduced value Th, i.e., a range where the length LE of each of the land electrodes 91B and 92B preferably is about 0.2 times to about 0.5 times the length LC of the elementary body 11, for example. In the third preferred embodiment, the reduced value Th is set to −10 dB of the peak vibration level in the cases of REF1. The reduced value Th can be increased or decreased depending on the situation in use of the monolithic capacitor, but a more satisfactory result is obtained by setting the reduced value Th to −10 dB, for example.

Thus, the vibration can be greatly reduced by setting the length LE of each of the land electrodes 91B and 92B to preferably fall in the range of about 0.2 times to about 0.5 times the length LC of the elementary body 11, for example. The vibration can be reduced to a larger extent by setting the length LE of each of the land electrodes 91B and 92B to be about 0.4 times the length LC of the elementary body 11, for example.

Figure 13:
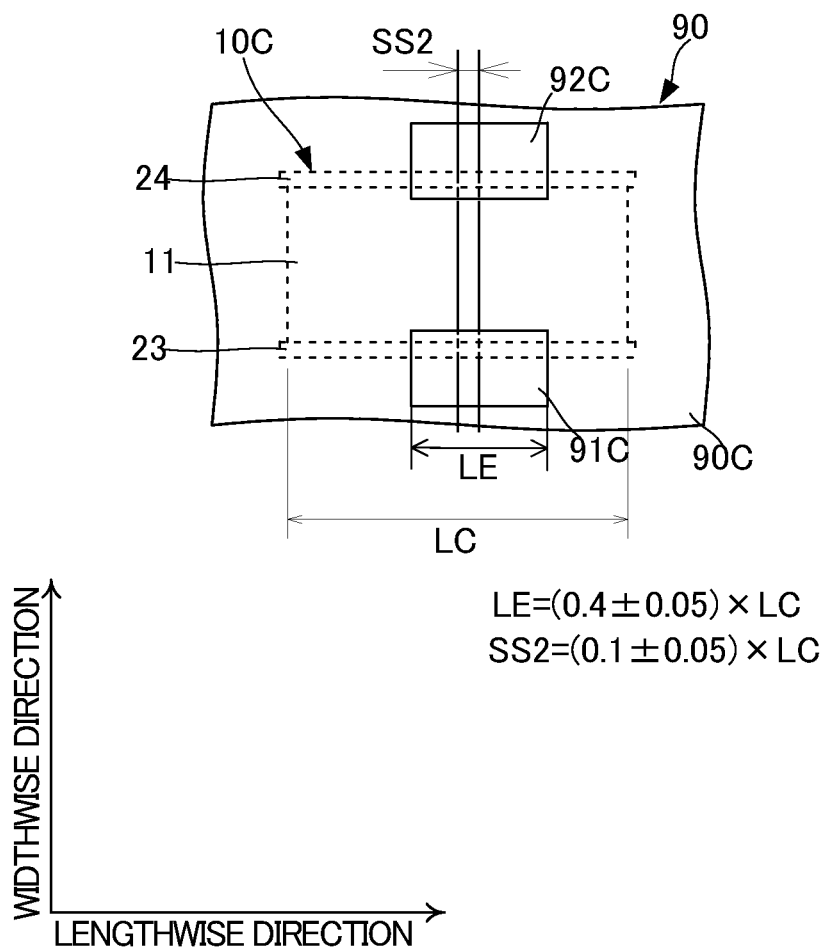
FIG. 13 is a plan view of a mounting substrate in a mounting structure according to a fourth preferred embodiment of the present invention.

A monolithic capacitor 10C mounting structure according to a fourth preferred embodiment of the present invention will be described below with reference to the drawings. FIG. 13 is a plan view of a mounting substrate 90 which preferably includes an insulating substrate 90C in the mounting structure according to the fourth preferred embodiment of the present invention. The mounting structure according to the fourth preferred embodiment is preferably different from the mounting structure according to the third preferred embodiment in that the positions of the land electrodes 91B and 92B in the lengthwise direction of the elementary body 11 are shifted (displaced). The other arrangement is the same as that of the mounting substrate 90 according to the third preferred embodiment, and detailed description of the other arrangement is omitted here.

In the mounting substrate 90 illustrated in FIG. 13, centers of the land electrodes 91C and 92C in the lengthwise direction are shifted from the center of the elementary body 11 in the lengthwise direction. An amount SS2 of such center shift preferably is about $0.1\pm0.05$ times the length LC of the elementary body 11, for example.

Figure 14:
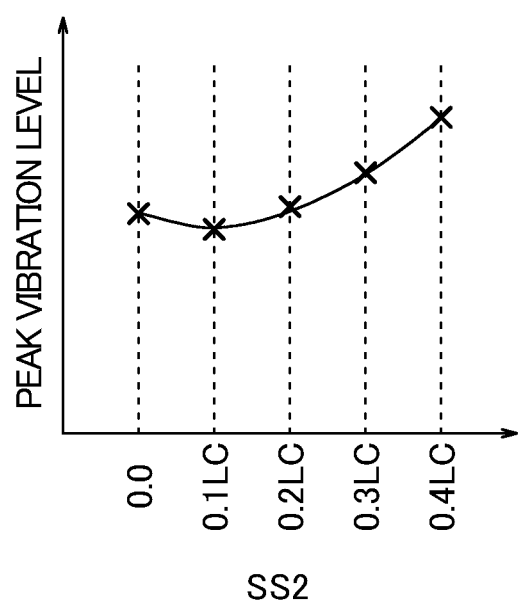
FIG. 14 is a graph representing a vibration noise suppression effect of the mounting substrate in the mounting structure according to the fourth preferred embodiment of the present invention.

FIG. 14 is a graph representing a vibration noise suppression effect of the mounting substrate 90. FIG. 14 represents the result in the case where the length LE of each of the land electrodes 91C and 92C preferably is about 0.2 times the length LC of the elementary body 11 of the monolithic capacitor 10B.

As seen from FIG. 14, the peak vibration level has a minimum value with respect to a ratio of the shift amount SS2 of each of the land electrodes 91B and 92B to the length LC of the elementary body 11. In more detail, as illustrated in FIG. 14, the peak vibration level has a minimum value at SS2=$(0.1\pm0.05)\times$LC, i.e., when the shift amount SS2 of each of the land electrodes 91B and 92B from the center position of the elementary body 11 in the lengthwise direction preferably is about 0.1 times the length LC of the elementary body 11, for example.

Accordingly, the vibration can be reduced to a larger extent by setting the shift amount SS2 of each of the land electrodes 91B and 92B to be about 0.1 times the length LC of the elementary body 11, for example.

In addition, the arrangement (positions and shapes) of the land electrodes may be specified as follows, based on both the results of FIGS. 12 and 14.

As seen from FIG. 12, the vibration noise is reduced when the length LE of each land electrode preferably is not more than about 0.5 times the length LC of the elementary body 11, for example.

As seen from FIG. 14, the vibration noise is also reduced by shifting the center of each land electrode in the lengthwise direction from the center of the elementary body 11 in the lengthwise direction preferably within the range of about 0.15 times the length LC of the elementary body 11, for example.

In consideration of the results described above, the ends of each land electrode in the lengthwise direction are arranged to position within the range of about 0.25 times the length LC of the elementary body 11 from the center of the elementary body 11 in the lengthwise direction. With such an arrangement, the vibration noise can preferably be reduced to a level not higher than a level obtained in the case where the center of each land electrode in the lengthwise direction is set in alignment with the center of the elementary body and the length LE of each land electrode is preferably set to be about 0.5 times the length LC of the elementary body 11, for example.

Accordingly, the land electrodes are preferably arranged such that the ends of each land electrode in the lengthwise direction are positioned within the range of about 0.25 times the length LC of the elementary body 11 from the center of the elementary body 11 in the lengthwise direction, for example.

The vibration noise can be more effectively reduced by including the mounting substrate, which includes the land electrodes having the above-described structure, as follows. FIG. 15 is a flowchart illustrating a method for reducing the vibration noise generated from the mounting substrate in accordance with a preferred embodiment of the present invention.

Vibration noise generated from a mounting substrate including a plurality of monolithic capacitors mounted thereon is measured (S201). The vibration noise can preferably be measured by, for example, a method of directly measuring the vibration noise with a microphone, a method of indirectly measuring the vibration noise by measuring vibration with a laser Doppler vibration meter, etc.

When the vibration noise exceeds a predetermined threshold, the mounted position of a monolithic capacitor that is a source of generating the vibration noise is specified (S202).

Land electrode patterns of the monolithic capacitor that is the source of generating the vibration noise is replaced with the land electrode patterns according to a preferred embodiment of the present invention (S203). In practice, for example, a conversion substrate or conversion patterns arranged to convert the land electrode patterns on the mounting substrate under the measurement to the land electrode patterns according to a preferred embodiment of the present invention may be disposed between the mounting substrate and the monolithic capacitor. Alternatively, when possible, the land electrode patterns on the mounting substrate may be modified. It is to be noted that the threshold for the vibration noise is preferably defined depending on, e.g., the intended use of an electronic device used in practice.

The vibration noise having generated prior to the replacement of the land electrode patterns can be reduced by utilizing the above-described method. An effect of the method of reducing the vibration noise, illustrated in FIG. 15, is experimentally proved for the case using a monolithic capacitor with a length LC=1.0 mm in the lengthwise direction, a width LCw=0.5 mm in the widthwise direction, and a height of 0.5 mm, for example. However, the above-described method can also be applied to monolithic capacitors having other dimensions.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A monolithic capacitor mounting structure comprising:
a monolithic capacitor including an elementary body having a parallelepiped shape or a substantially parallelepiped shape and defined by plural dielectric layers and plural inner electrodes, which are alternately stacked, only one first outer electrode located on a first side surface, extending in a lengthwise direction, of the elementary body, and only one second outer electrode located on a second side surface, extending in the lengthwise direction, of the elementary body;
a mounting substrate including an insulating substrate, a first land electrode disposed on a surface of the insulating substrate and connected to the first outer electrode, and a second land electrode disposed on the surface of the insulating substrate and connected to the second outer electrode;
a first bonding material arranged to bond the first outer electrode and the first land electrode; and
a second bonding material arranged to bond the second outer electrode and the second land electrode; wherein
a portion of the first outer electrode joined with the first bonding material is a first bonding portion and a portion of the second outer electrode joined with the second bonding material is a second bonding portion;
a length of each of the first and second bonding portions in the lengthwise direction is about 0.2 times to about 0.5 times a length of the elementary body in the lengthwise direction; and
a center of each of the first and second bonding portions in the lengthwise direction is located at a position different from a center of the elementary body in the lengthwise direction.

2. The monolithic capacitor mounting structure according to claim 1, wherein the length of each of the first and second bonding portions in the lengthwise direction is within a range of about 0.4±0.05 times the length of the elementary body in the lengthwise direction.

3. The monolithic capacitor mounting structure according to claim 2, wherein a length of each of the first and second land electrodes in the lengthwise direction is within a range of about 0.4±0.05 times the length of the elementary body in the lengthwise direction.

4. The monolithic capacitor mounting structure according to claim 1, wherein the first and second bonding portions extending in the lengthwise direction are arranged such that ends of each of the first and second bonding portions in the lengthwise direction are positioned within a range of about 0.25 times the length of the elementary body in the lengthwise direction from the center of the elementary body in the lengthwise direction.

5. The monolithic capacitor mounting structure according to claim 4, wherein the first and second outer electrodes are arranged such that ends of each of the first and second outer electrodes in the lengthwise direction are positioned within a range of about 0.25 times the length of the elementary body in the lengthwise direction from the center of the elementary body in the lengthwise direction.

6. The monolithic capacitor mounting structure according to claim 4, wherein the first and second land electrodes are arranged such that ends of each of the first and second land electrodes in the lengthwise direction are positioned within a range of about 0.25 times the length of the elementary body in the lengthwise direction from the center of the elementary body in the lengthwise direction.

7. The monolithic capacitor mounting structure according to claim 1, wherein a distance between the center of each of the first and second bonding portions in the lengthwise direction and the center of the elementary body in the lengthwise direction is within a range of about 0.1±0.05 times the length of the elementary body in the lengthwise direction.

8. The monolithic capacitor mounting structure according to claim 7, wherein a distance between the center of each of the first and second outer electrodes in the lengthwise direction and the center of the elementary body in the lengthwise direction is within a range of about 0.1±0.05 times the length of the elementary body in the lengthwise direction.

9. The monolithic capacitor mounting structure according to claim 7, wherein a distance between a center of each of the first and second land electrodes in the lengthwise direction and the center of the elementary body in the lengthwise direction is within a range of about 0.1±0.05 times the length of the elementary body in the lengthwise direction.

10. The monolithic capacitor mounting structure according to claim 1, wherein the length of each of the first and second outer electrodes in the lengthwise direction is about 0.2 times to about 0.5 times the length of the elementary body in the lengthwise direction; and a center of each of the first and second outer electrodes in the lengthwise direction is located at a position different from the center of the elementary body in the lengthwise direction.

11. The monolithic capacitor mounting structure according to claim 1, wherein the length of each of the first and second outer electrodes in the lengthwise direction is within a range of about 0.4±0.05 times the length of the elementary body in the lengthwise direction.

12. The monolithic capacitor mounting structure according to claim 1, wherein a length of each of the first and second land electrodes in the lengthwise direction is about 0.2 times to about 0.5 times the length of the elementary body in the lengthwise direction; and a center of each of the first and second land electrodes in the lengthwise direction is located at a position different from the center of the elementary body in the lengthwise direction.

13. The monolithic capacitor mounting structure according to claim 1, wherein the first bonding material and the second bonding material are both a solder.

14. A monolithic capacitor comprising:

an elementary body having a parallelepiped shape or a substantially parallelepiped shape and defined by plural dielectric layers and plural inner electrodes, which are alternately stacked, only one first outer electrode located on a first side surface, extending in a lengthwise direction, of the elementary body, and only one second outer electrode located on a second side surface, extending in the lengthwise direction, of the elementary body; wherein a length of each of the first and second outer electrodes in the lengthwise direction is about 0.2 to times to about 0.5 times a length of the elementary body in the lengthwise direction; and a center of each of the first and second outer electrodes in the lengthwise direction is located at a position different from a center of the elementary body in the lengthwise direction.

15. The monolithic capacitor according to claim 14, wherein the length of each of the first and second outer electrodes in the lengthwise direction is within a range of about 0.4±0.05 times the length of the elementary body in the lengthwise direction.

16. The monolithic capacitor according to claim 14, wherein the first and second outer electrodes are arranged such that ends of each of the first and second outer electrodes in the lengthwise direction are positioned within a range of about 0.25 times the length of the elementary body in the lengthwise direction from the center of the elementary body in the lengthwise direction.

17. The monolithic capacitor according to claim 14, wherein a distance between the center of each of the first and second outer electrodes in the lengthwise direction and the center of the elementary body in the lengthwise direction is within a range of about 0.1±0.05 times the length of the elementary body in the lengthwise direction.

18. A monolithic capacitor mounting structure comprising:

a monolithic capacitor including an elementary body having a parallelepiped shape or a substantially parallelepiped shape and defined by plural dielectric layers and plural inner electrodes, which are alternately stacked, only one first outer electrode located on a first side surface, extending in a lengthwise direction, of the elementary body, and only one second outer electrode located on a second side surface, extending in the lengthwise direction, of the elementary body extending in the lengthwise direction thereof;

a mounting substrate including an insulating substrate, a first land electrode disposed on a surface of the insulating substrate and connected to the first outer electrode, and a second land electrode disposed on the surface of the insulating substrate and connected to the second outer electrode; wherein a length of each of the first and second land electrodes in the lengthwise direction is about 0.2 times to about 0.5 times a length of the elementary body in the lengthwise direction; and a center of each of the first and second land electrodes in the lengthwise direction is located at a position different from a center of the elementary body in the lengthwise direction.

19. The monolithic capacitor mounting structure according to claim 18, wherein the length of each of the first and second land electrodes in the lengthwise direction is within a range of about 0.4±0.05 times the length of the elementary body in the lengthwise direction.

20. The monolithic capacitor mounting structure according to claim 18, wherein each of the first and second land electrodes have a same or substantially a same length and are arranged at a same or substantially a same position in the lengthwise direction.

* * * * *